United States Patent [19]

Gordon et al.

[11] 4,301,418
[45] Nov. 17, 1981

[54] MAGNETORESISTIVE POWER AMPLIFIER

[75] Inventors: Daniel I. Gordon, Chevy Chase; Leonard J. Schwee, Colesville; Wallace E. Anderson, Beltsville, all of Md.

[73] Assignee: The United States of America as represented by the Secretary of the Navy, Washington, D.C.

[21] Appl. No.: 942,006

[22] Filed: Sep. 13, 1978

[51] Int. Cl.³ ............................................. H03F 15/00
[52] U.S. Cl. .................................................. 330/62
[58] Field of Search .................. 330/61 R, 62, 63; 365/158; 307/309

[56] References Cited

U.S. PATENT DOCUMENTS 3,382,448  5/1968  Oberg et al. ........................ 330/62
3,382,449  5/1968  Enomoto ............................ 330/62

OTHER PUBLICATIONS

Gordon et al., "A Sensitive Magnetoresistive Power Amplifier", *Digests of the Intermag Conference, IEEE,* Jun. 5, 1977, pp. 2–7.
Gordon et al., "A Sensitive Magnetoresistive Power Amplifier", IEEE Transactions on Magnetics, vol. Mag-13, No. 5, Sep. 14, 1977.

*Primary Examiner*—James B. Mullins
*Attorney, Agent, or Firm*—R. S. Sciascia; A. L. Branning; R. E. Bushnell

[57] ABSTRACT

A process and a small, sensitive, low noise, high gain, power amplifier used in the process, for exploiting the anisotropic magnetoresistance effect in a ferromagnetic thin-film. The magnetization of the thin-film is biased to lie along the hard axis. The amplifier is configured so that a sensing current in the thin-film flows at an angle of forty-five degrees to the nominal direction of magnetization, and the current to be amplified produces a magnetic field parallel to the easy axis of the thin-film.

13 Claims, 12 Drawing Figures

MAGNETORESISTIVE POWER AMPLIFIER

BACKGROUND OF THE INVENTION

This invention relates to amplifiers and processes for amplifying electric signals, and more particularly, to electrical devices relying upon magnetoresistance effects to provide power amplication.

State-of-the-art magnetoresistance amplifiers such as those disclosed in U.S. Pat. No. 3,382,448, granted to Paul E. Oberg, et alii, are constructed with a signal circuit overlying a thin-film of a magnetic material. There, a slab of a magnetic material forms an element of a sense circuit magnetically coupled to an equal area of the signal circuit. The magnetization vector of the sense circuit has a preferred axis alignment. The circuits are oriented so that current in the signal circuit creates a magnetic signal field that rotates the magnetization vector about its preferred axis orientation. Note that in a uniaxially anisotropic film the preferred axis is the easy axis, while in an isotropic film the preferred axis is the bias field axis. Other amplifiers are constructed with the signal circuit sandwiched between opposite thin-films of magnetic material having antiparallel magnetization. As can be shown by performing a minimization of free-energy calculation (e.g., see D. O. Smith, Journal of Applied Physics, volume 29, at 274; 1958), if the signal field is applied along the hard axis of the magnetoresistive element and the zero signal orientation of the magnetization vector, $\vec{M}$, is along the easy axis, the rotation of the magnetization vector away from its zero signal orientation by the magnetic field created by a signal current is:

$$(H_s/H_k) = \text{SIN } \phi, \quad (1)$$

which becomes:

$$(H_s/H_k) \approx \phi \quad (2)$$

for small signals. In practice, the power gain provided by articles of the type described here ranges from less than one to about ten.

A thin-film is a layer of material having a thickness between one hundred angstroms and one hundred thousand angstroms. "Ferro-magnetic" describes a material with a relative permeability that is greater than one in value and that depends upon the magnitude of the magnetizing force.

SUMMARY OF THE INVENTION

A process and a four port article used in the process for exploiting the anisotropic magnetoresistance effect in a thin-film of a ferromagnetic sense circuit to provide power amplification of an electrical current flowing through a magnetically coupled, but electrically isolated signal circuit. The nominal direction of magnetization in the ferromagnetic film is oriented parallel to the hard axis of the film by a bias field having a magnitude nearly equal to that of the anisotropy field applied along the hard axis. The sense circuit is configured to direct sense currents along paths oriented at forty-five degrees to the nominal direction of magnetization. The signal circuit through which the electrical current to be amplified flows is a strip conductor overlying and obliquely transversing the paths of the sense currents in the ferromagnetic film along a path parallel to the hard axis, thereby creating a magnetic signal field parallel to the easy axis of the ferromagnetic film. Variations in the magnetic signal field cause the direction of magnetization in the ferromagnetic film to rotate away from the hard axis of the film.

In one embodiment, the direction of the sense current flow relative to the magnetic signal field is controlled by cutting the ferromagnetic layer forming the sense circuit at an angle of forty-five degrees with the transversing signal circuit sections while in another embodiment, series of islands of an electrically conducting material having a lower resistivity in comparison to the ferromagnetic layer are uniformly spaced apart along the ferromagnetic film to provide lower resistance paths for the sense current in parallel with the ferromagnetic film. In both embodiments the direction of the signal current flow in the transversing signal circuit sections is parallel to the hard axis of the sense circuit while the direction of the sense current in the segments of the underlying ferromagnetic layer is at forty-five degrees to the hard axis.

It is therefore among the objects of the present invention to exploit the magneto-resistance effect to provide power amplification.

It is a second object to provide power amplification at a low noise level.

It is another object to provide power amplification with a high level of sensitivity.

It is yet another object to provide power amplification over a wide bandwidth.

It is also an object of the present invention to provide a magnetoresistance amplifier having a size smaller than presently available magnetoresistance amplifiers.

It is also another object to provide a magnetoresistance amplifier compatible with silicon wafer semiconductor devices.

It is also yet another object to provide a magnetoresistance amplifier exhibiting good radiation resistance.

It is also still another object to provide a magnetoresistance amplifier with high sensitivity and a wide bandwidth.

BRIEF DESCRIPTION OF THE DRAWINGS

A more complete appreciation of this invention, its objects and many of the attendant advantages thereof, will be readily enjoyed as the same becomes better understood by reference to the following detailed description when considered in conjunction with the accompanying drawings in which like numbers indicate the same or similar components, wherein.

DETAILED DESCRIPTION

The anisotropic magnetoresistance effect in a ferromagnetic material is the decrease in resistivity of the material as the magnetization vector, M, is rotated away from a direction parallel to the current, $I_o$, in the material. In particular, the dependence of resistivity, $\rho$, on the angle, $\xi$, between the magnetization vector and the current is:

$$\rho = \rho_o + \frac{\Delta\rho \cos 2\xi}{2} \tag{3}$$

where $\rho$ is the resistivity of the ferromagnetic material measured in a direction parallel to the direction of current $I_o$, and:

$$\rho_o = \frac{\rho_{||} + \rho_\perp}{2} \tag{4}$$

$$\Delta\rho = \rho_{||} - \rho_\perp \tag{5}$$

Note that $\rho_{||}$ is the value of the resistivity when the magnetization vector is parallel to $I_o$ while $\rho_\perp$ is the value of resistivity when the magnetization vector is perpendicular to $I_o$. An example of the variation of the measured resistance with the angle $\xi$ is shown in Table I.

TABLE 1

| $\xi$, degrees | $\rho$, percentage |
|---|---|
| 0 | 100 |
| 15 | 99.5 |
| 45 | 99.0 |
| 90 | 98.0 |

The resistivity is at its greatest value when the magnetization vector is parallel to the current and at its least value when the magnetization vector is perpendicular to the current. The difference in value between $\rho_{81}$ and $\rho_\perp$ is two to three percent of $\rho_0$, depending upon material. By taking the first derivative of equation (1), setting the first derivative equal to zero, and then solving the equation, it may be shown that the rate of change of the resistivity with respect to $\xi$ is greatest when $\xi$ equals forty-five degrees.

To exploit the anisotropic magnetoresistance effect in an amplifier, the signal current, $I_s$, to be amplified flows in a signal circuit made from a strip of an electrical conductor, such as gold, that overlays and is magnetically coupled to, but electrically isolated from, a thin-film of a magnetic material such as permalloy. The magnetic signal field, $H_s$, created by the signal current rotates the magnetization vector in the thin-film away from a preset preferred orientation, thereby changing the value of the angle $\xi$ and thus, the resistivity of and the current in the thin-film. Hence, variations in the sense current, $I_o$, in the thin-film are caused by variations in the signal current, $I_s$, in the overlaid signal circuit. In order to obtain the greatest current gain and power gain from this effect, thin-films of aniso-tropic ferromagnetic materials such as permalloy may be used.

Figures 1, 2:
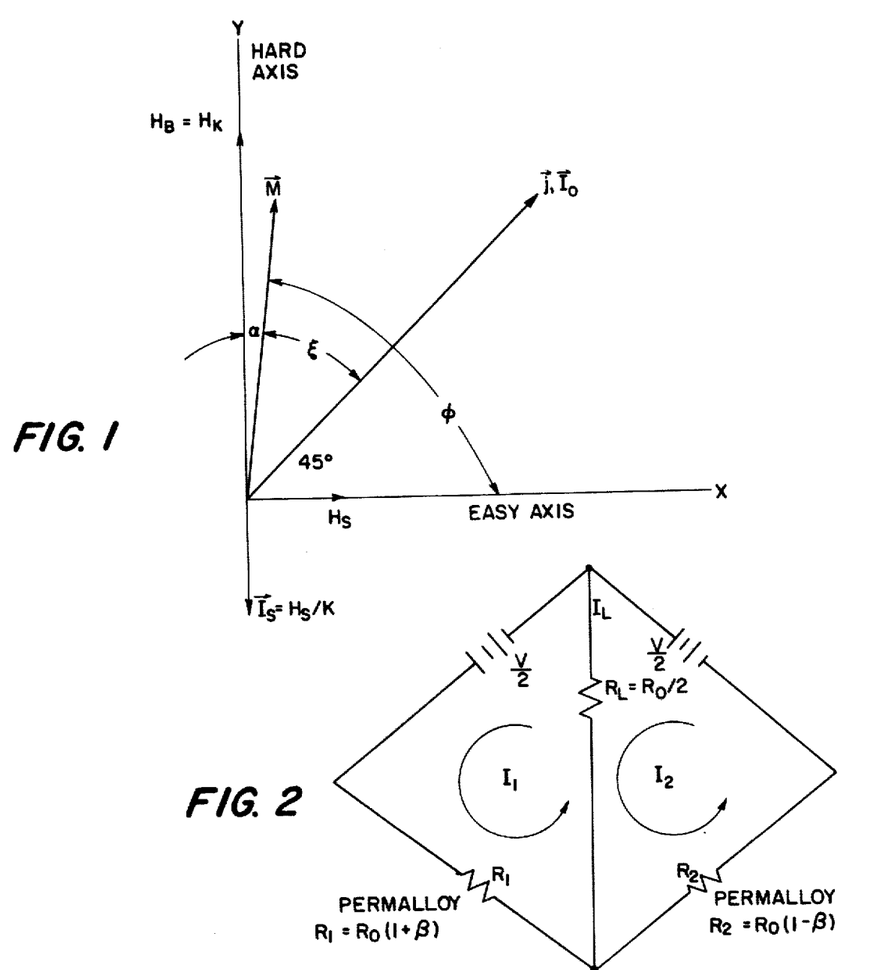
FIG. 1 is a two coordinate, orthogonal graph showing several vector values associated with the magnetoresistance phenomena in thin-films.
FIG. 2 is the circuit schematic of a balanced bridge circuit.

Referring now to the drawings, and in particular to FIG. 1, a two coordinate orthogonal graph illustrates the magnitude and orientation of the several vector quantities under discussion. If a bias field, $H_B$, with a magnitude equal to or slightly greater than the magnitude of the anisotropy field, $H_k$, is applied along the hard axis, the orientation of the magnetization vector, M, is along the hard axis (i.e., the y-axis) when the signal current, $I_s$, is zero, then it can be shown that the dependence of the angular rotation, $\alpha$, of the magnetization vector in a ferromagnetic layer on the signal current, for small values of signal current applied to parallel to the hard axis is:

$$\alpha \simeq [2H_s/H_k]^{\frac{1}{2}} = [2KI_s/H_k]^{\frac{1}{2}}, \tag{6}$$

where K is the proportionality constant between the signal current and the signal field, $H_s$. If, in addition, the sense current, $I_o$, in the magnetic film sense current is oriented at forty-five degrees to the easy (i.e., x) and hard (i.e., y) axis, the expression for resistivity, equation (3), becomes:

$$\rho = \rho_o + \Delta\rho \frac{\sin 2\alpha}{2} \tag{7}$$

and the maximum sensitivity, $d\rho/d\alpha$, for small signals (i.e., small $I_s$ and hence, small $\alpha$) is provided. Furthermore, the greatest variation in sense current with respect to signal current, that is, $dI_o/dI$, is obtained. The amount of energy associated with the circuit, is:

$$E = \frac{1}{2}\vec{M}H_k\cos^2\alpha - (\vec{H}\cdot\vec{M}) \tag{8}$$

where:

$$H = i\,H_s + j\,H_B, \text{ and} \tag{9}$$

$$H_B = H_k. \tag{10}$$

The external applied field, $\vec{H}$, includes the signal and bias fields. Performing the magnetization of free energy calculation according to D. O. Smith, one obtains a high value of rotational sensitivity as a function of signal field, as shown by equation (6). Comparing the rotation sensitivity achieved by prior art structures relying upon rotations of the magnetization vector about the easy axis, as is expressed in equations (1) and (2), with the rotational sensivity possible when the magnetization vector rotates about the hard axis, as is expressed in equation (6), significantly larger small-signal sensitivity is provided by the latter case.

Refer now to FIG. 2 where a bridge circuit is shown with two adjoining thin-films of permalloy forming two discrete resistive elements, $R_1$ and $R_2$. Both permalloy resistive elements have parallel hard axes. Both permalloy resistive elements are subject to a uniform bias field, $H_B$, with a magnitude equal to that of the anisotropy field, $H_k$, and a direction along the hard axis of the elements. The sense circuit is constructed as a balanced bridge circuit to eliminate the quiescent (i.e., zero signal) sense current because the anisotropic magnetoresistance effect in ferromagnetic materials is small, typically on the order of two to three percent. Two series coupled voltage sources of equal value, V/2, form the other two arms of the sense circuit bridge. One output terminal is connected at the node point between the two permalloy resistances while the other output terminal is coupled at the diagonally opposite node between the two voltage sources. From equation (7), it may be shown that the resistance in either permalloy magnetoresistance element is:

$$R = R_o \pm \Delta \frac{R \, SIN \, 2\alpha}{2}. \quad (11)$$

Figure 2A:
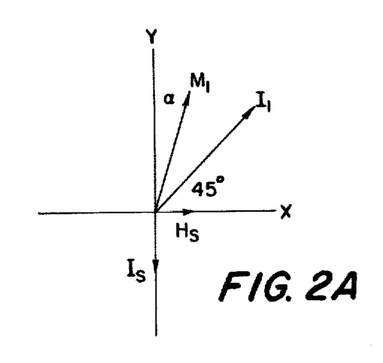
FIG. 2A is a two coordinate, orthogonal graph showing the several vector values associated with the magnetoresistance arm $R_1$ of the balanced bridge circuit shown in FIG. 2.
Figure 2B:
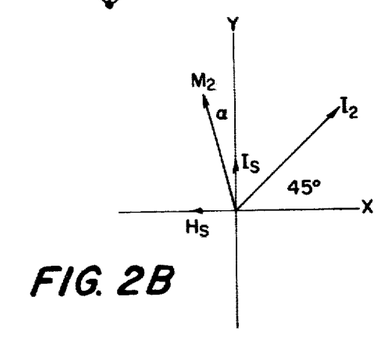
FIG. 2B is a two coordinate, orthogonal graph showing the several vector values associated with the magnetoresistance arm $R_2$ of the balanced bridge circuit shown in FIG. 2.

Assuming the directions of the signal fields, signal and sense current flow shown in FIGS. 2A and 2B, the resistances of the individual elements $R_1$, $R_2$, respectively, are:

$$R_1 = R_o + \frac{\Delta R \, SIN \, 2\alpha}{2} \quad (12)$$

$$R_2 = R_o - \Delta \frac{R \, SIN \, 2\alpha}{2}. \quad (13)$$

For efficient energy transfer the value of the load resistance, $R_L$, may be made equal to $R_o/2$. The output current, $I_L$, through the lead resistance is the difference between the currents $I_1$ and $I_2$ through the two branches of the bridge sense circuit. If the resistance of the signal circuit, $R_S$, is made equal to the value of the load resistance, $R_L$, it can be shown that the magnetoresistance amplifier current gain is:

$$\frac{I_L}{I_s} = \frac{I_o \Delta \rho}{\rho_o} \left[ \frac{2K}{H_k} \right]^{\frac{1}{2}} I_s^{-\frac{2}{3}}, \quad (14)$$

and that the power gain is:

$$\left[ \frac{I_L}{I_s} \right]^2 = I_o^2 \frac{\Delta \rho}{\rho_o} \left[ \frac{2K}{H_k} \right]^{\frac{2}{3}} I_s^{-4/3} \quad (15)$$

Figure 3:
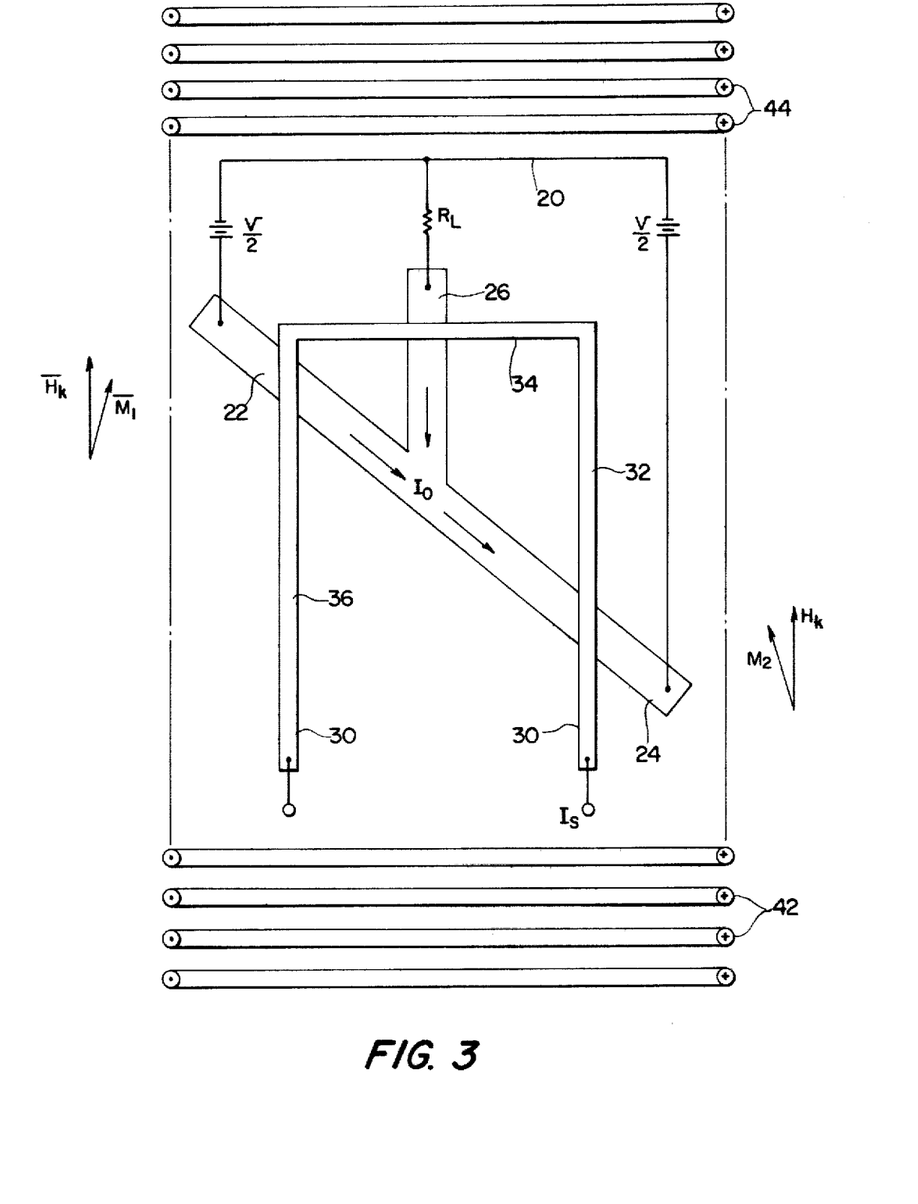
FIG. 3 is a top view of a magnetoresistive amplifier showing the signal, sense, and bias circuits.

Turn now to FIG. 3 of the drawings where a top view shows, with exaggerated dimensions, the sense circuit 20, the signal circuit 30, and the bias circuit 40 of a balanced bridge, magnetoresistive amplifier. The signal current, $I_s$, flows through a square spiral 32, 34, 36 of the signal circuit. The square spiral is made from a low resistance electrical conductor such as gold laid over and magnetically coupled to a layer of a magnetoresistive material forming elements 22, 24, 26 of the sense circuit 20. An intermediate layer (not shown) of a material such as silicon dioxide, electrically insulates the signal and sense circuits. Opposite sides 32, 34 of the signal circuit are obliquely oriented at forty-five degrees to the underlying adjoining arms 24, 22, respectively, of the balanced bridge sense circuit 30. The two adjoining arms 22, 24, and their common node 26, are made from a single layer of a ferromagnetic material deposited on an electrically insulating substrate, such as silicon oxide (not shown), silicon, or glass. The terminals of adjoining magnetoresistive arms 22 (i.e., $R_1$) and 24 (i.e., $R_2$) opposite node 26 are coupled across equal series aiding voltage sources. The bias circuit 40 is formed by a cylindrical solenoid annularly wound around the signal and sense circuits. The central axis of the cylindrical solenoid (partially shown only in its end windings 42, 44) is parallel to the hard axis of the magnetoresistive elements 22, 24.

In operation, a bias field created by a current through the annular coils of bias solenoid 40 orients the magnetization vectors of the resistive elements 22, 24 and the node element 26 nearly parallel to the hard axis of those elements. A signal current introduced into the square spiral of the signal circuit 30 creates a signal field about the signal circuit. A positive current flowing into the right arm 32 of the signal circuit creates a signal field perpendicular to the direction of current flow that causes the magnetization vector, $M_2$, in magnetoresistive element 32 to rotate counterclockwise away from the hard axis of element 32. The same current flowing through the left arm 36 also creates a signal field perpendicular to the direction of current flow, but one that causes the magnetization vector, $M_1$, in the magnetoresistive element 36 to rotate clockwise away from the hard axis of element 36. Although irrelevant to the performance of the amplifier, it may be noted that the signal field created by the same current flowing through the arm 34 linking arms 32 and 36, reinforces the alignment of the magnetization vector in the node element 26 of the sense circuit.

Figure 4:
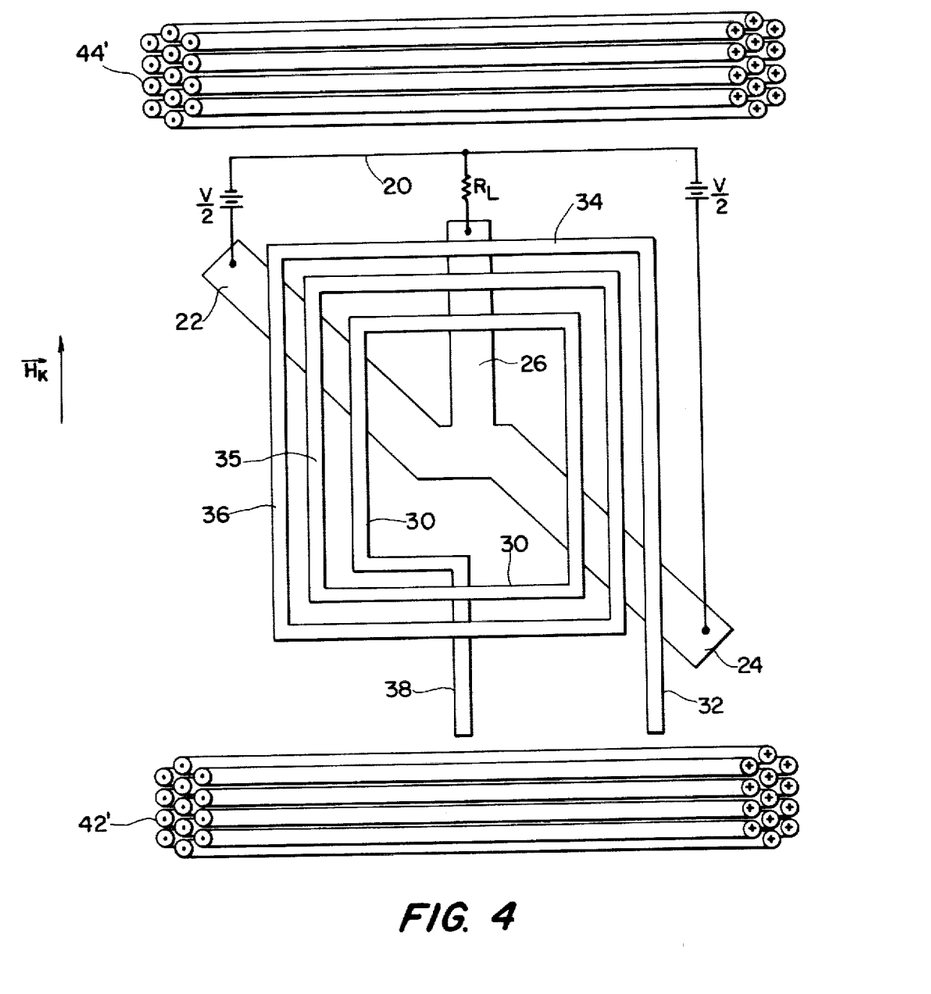
FIG. 4 is a top view of a magnetoresistive amplifier showing the signal, sense, and bias circuits.

FIG. 4 is a top view showing, again with exaggerated dimensions, the sense circuit 20, the signal circuit 30, and the bias circuit 40' of a second amplifier using magnetoresistive elements in a balanced bridge sense circuit. The amplifier differs from that shown in FIG. 3 by the number of square spirals of decreasing dimensions formed by the signal circuit. The use of a plurality of square spirals in the signal circuit rather than a single square spiral 32, 34, 36 assures a more uniform rotation of the magnetization vectors throughout the magnetoresistive elements 22, 24, thereby enhacing the amplification provided. An intermediate layer (not shown) of a material such as silicon dioxide, electrically insulates the signal circuits from the underlying sense circuits as well as the tag end 38 of the signal circuit from the overlaid connecting links of the signal circuit. Two series aiding coils 42', 44' positioned at opposite ends of the sense circuit and annularly wound about an axis parallel to the hard axis of magnetoresistive element 22, 24, form the bias circuit. As in the amplifier previously described, the magnetic bias field created by the bias circuit, if equal in magnitude to the anisotropy field, aligns the magnetization vectors of the magnetoresistive elements 22, 24, 26 nearly parallel to their hard axis.

Figure 5:
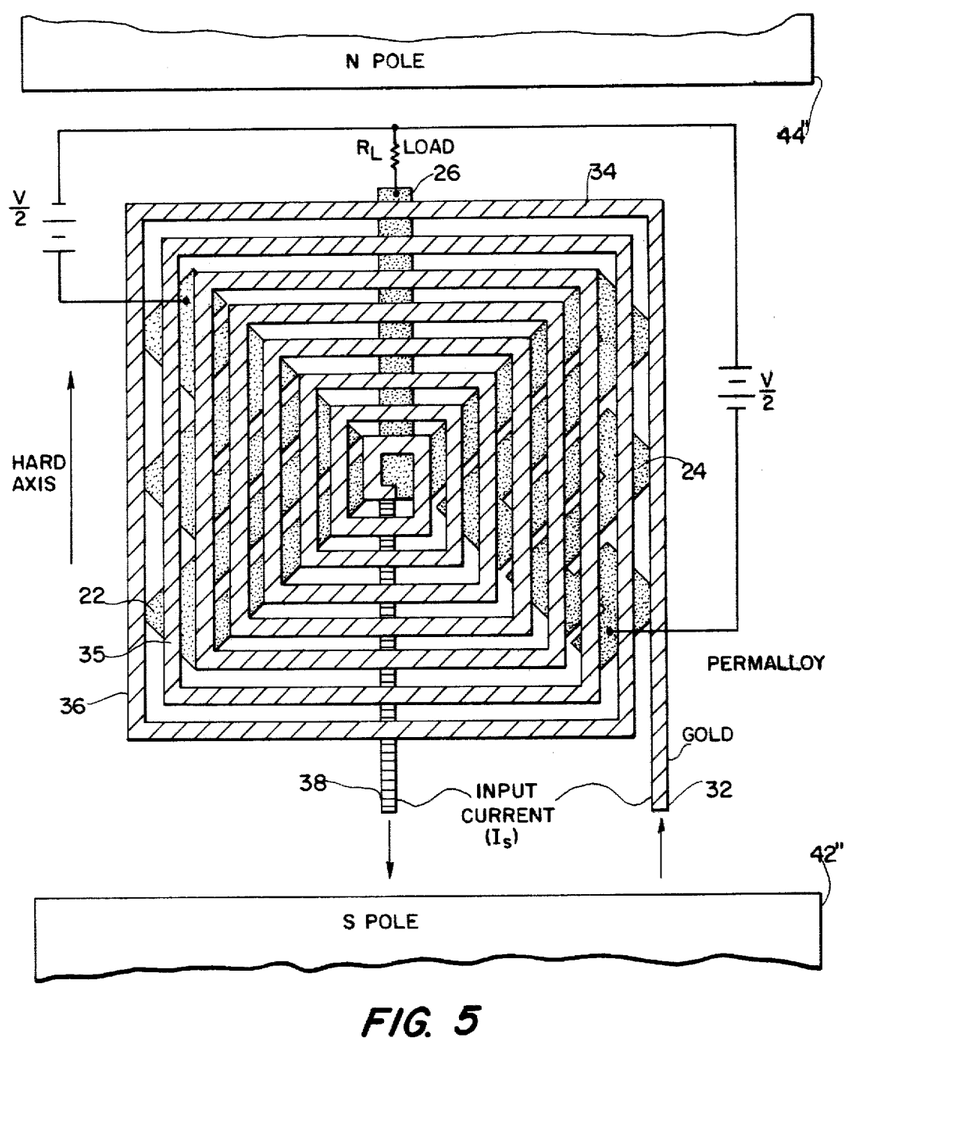
FIG. 5 is a top view of a magnetoresistive amplifier showing the signal, sense, and bias circuits.

FIG. 5 is a top view showing, again with exaggerated dimensions, the sense circuit 20, the signal circuit 30, and the bias circuit 40" of another amplifier using magnetoresistance elements in a balanced bridge sense circuit. The signal current to be amplified flows through the signal circuit formed by the square spiral of gold strips 32, 34, 36, . . . 38 overlain upon an electrical insulator (not shown) separating the sense circuit from the signal circuit. The sense circuit is a balanced bridge having as two adjoining arms 22, 24, a layer of permalloy deposited in the form of a folded ribbon (i.e., a thunderbird maze). Both the plica and the connecting links of the ribbon of permalloy are at an angle of forty-five degrees to both the hard axis of the layer and the transversing sections (e.g., 34, 36) of the overlain signal circuit. The bias circuit includes the south pole 42" of a magnet spaced apart from one edge of the magnetoresistive layer 22, 24, 26 opposite the north pole 44" of a magnet spaced apart from the opposite edge of the magnetoresistive layer. The magnet forming the bias circuit is selected to provide a bias field equal in strength to that of the anisotropy field of the magnetoresistive layer 22, 24, 26, and is positioned so as to orient the magnetization vectors in near parallel alignment with the hard axis of the layer.

The signal circuit (i.e., the layer of gold deposited in the shape of a square spiral) and the sense circuit (i.e., the two arms adjoining node point 26 formed by a layer of permalloy deposited in the shape of a thunderbird maze) are designed to have equal resistances. Both circuits are, from a top view, contained within a square of side S. The other design characteristics of the amplifier circuits are set forth in Table II.

TABLE II

|  | Input Level | Insulator Level | Output Level | Units |
| --- | --- | --- | --- | --- |
| Material | Gold | SiO$_2$ | Permolloy | — |
| Configuration | Square Spiral | — | Thunderbird Maze | — |
| Thickness (t) | 1 | 1 | 0.1 | μm |
| Path Width (d) | 5 | — | d$_o$ | μm |
| Gap (g) | 2 | — | 2 | μm |
| Square Side | S | — | S | μm |
| Resistivity (ρ) | 2.4 × 10$^{-6}$ | — | 16 × 10$^{-6}$ | Ωcm |
| Resistance (R) | 50 | — | 50 | Ω |
| Current Density(j$_o$) | — | — | 10$^6$ | A/cm$^2$ |
| ΔR/R$_o$ | — | — | 0.03 | — |
| H$_k$ | — | — | 4 | Oe |

The two variable values are the length of the side of the square, S, and the width of the permalloy current path, d$_o$. Equations expressing the resistances of the gold signal circuit and the permalloy sense circuit in terms of the values set forth in Table II, are respectively:

$$R_s = \frac{\rho G}{t_G} S^2 + 4d_s(g + d_s) \quad (16)$$

$$R_o = \frac{\rho P}{t_P} S^2 + 4d_o(g + d_o) \quad (17)$$

Simultaneous solution of the two equations yields S and d$_o$.

In order to minimize the demagnetizing effects caused by the geometry of the permalloy maze pattern, a gap width of two microns between adjacent strips of the maze was chosen. The value of the width of the permalloy strip, d$_o$, obtained by simultaneous solution of equations (16) and (17), is sixteen microns. The demagnetizing field in the easy axis direction should be small because the signal fields created by the currents to be amplified are very small (i.e., H$_s$<0.01 Oe). To obtain an effective bias field in the hard axis direction equal in magnitude to the anisotropy field, it is estimated that an applied field of thirty-six oerstads is necessary because of the demagnetizing effect.

The gain of the magnetoresistive amplifier described is susceptible to expression in an equation where the load current, I$_L$, is a function of the signal current, I$_s$. The signal current creates the signal field, H$_s$, which in turn causes the magnetization vector, $\vec{M}$, to rotate through an angle away from the hard axis. In turn, rotation of M causes a change in the resistance of the permalloy layer, 22 or 24, which controls the load current. Using equations (12) and (13) to solve for the load current in the bridge circuit, $$I_L = \beta I_o \quad (18)$$

where:

$$\beta = \frac{\Delta R}{R_o} \cos^\alpha \text{SIN}^\alpha \approx \frac{\Delta R}{R_o} \quad (19)$$

and:

$$I_o = \frac{V}{2R_o} \quad (20)$$

With the relation expressed by equation (6), where the proportionality constant, K, is a function of the width of the signal circuit spiral, d$_s$, and the distance of separation between the signal circuit spiral and the sense circuit, that is, the thickness of the layer of insulation separating the two circuits, $$I_L = I_o \left[ \frac{\Delta R}{R_o} \right] \left[ \frac{2K I_s}{H_k} \right]^{\frac{1}{3}} \quad (21)$$

In this example, the proportionality constant, K, equals 817 Oe/Ampere. The power gain, G$_p$, is:

$$G_p = \frac{I_L^2 R_L}{I_s^2 R_i} \quad (22)$$

where R$_i$ is the resistance of the signal circuit. If the amplifier is designed with equal resistance in the signal and load circuits, that is, so that R$_i$=R$_L$, and if the load resistance is chosen to equal one half of the zero signal resistance of either magnetoresistive element 22, 24, that is, so that R$_L$=R$_o$/2, then:

$$G_p = I_o^2 \left[ \frac{\Delta R}{R_o} \right]^2 \left[ \frac{2H_k}{H_k} \right]^{\frac{1}{3}} I_s^{4/3}. \quad (23)$$

Note that the power gain for this amplifier varies as I$_s^{-4/3}$, and becomes very large for small values of signal current. In contrast, the theoretical power gain for an amplifier designed to have the magnetization vector rotate about the easy axis is:

$$G_p = I_o^2 \left[ \frac{\Delta R}{R_o} \right]^2 \left[ \frac{K}{H_k} \right]^2 \quad (24)$$

which, although independent of signal current, is less than one.

Figure 6A:
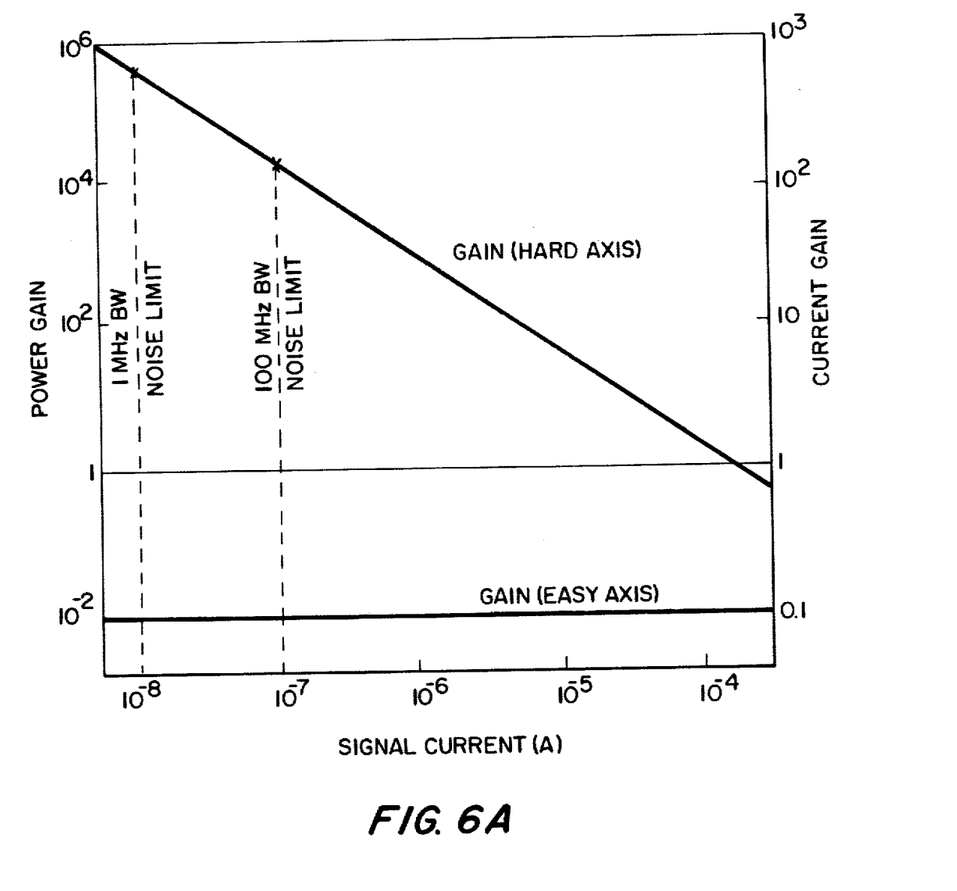
FIG. 6A is an orthogonal, two coordinate graph showing calculated power and current gain as a function of the signal current for prior art magnetoresistive amplifiers in comparison with embodiments of the instant invention.

By way of example, a magnetoresistance amplifier of approximate dimensions of 300 by 300 by 2.0 microns, with equal load and signal circuit resistances of fifty ohms each, has the calculated gain characteristics shown in FIG. 6A. The power gain, about 600,000 with an 10$^{-8}$ ampere signal current, decreases as I$^{-4/3}$, and reaches unity at 2.10$^{-4}$ amperes. Johnson noise is the only noise source in this amplifier. Therefore, the lowest detectable signal depends upon the bandwidth required. At room temperature, the lowest detectable signal is 10$^{-7}$ amperes with a 100 megahertz bandwidth, and 10$^{-8}$ amperes for a one megahertz bandwidth. Note that while the power gain for an amplifier having the magnetization vector aligned along the hard axis falls to a value less than one only with a signal current greater than 10$^{-4}$ amperes, the power gain of a magnetoresistive amplifier with the magnetization vector aligned along the easy axis is independent of the signal current, and constant at a value less than one.

Figure 6B:
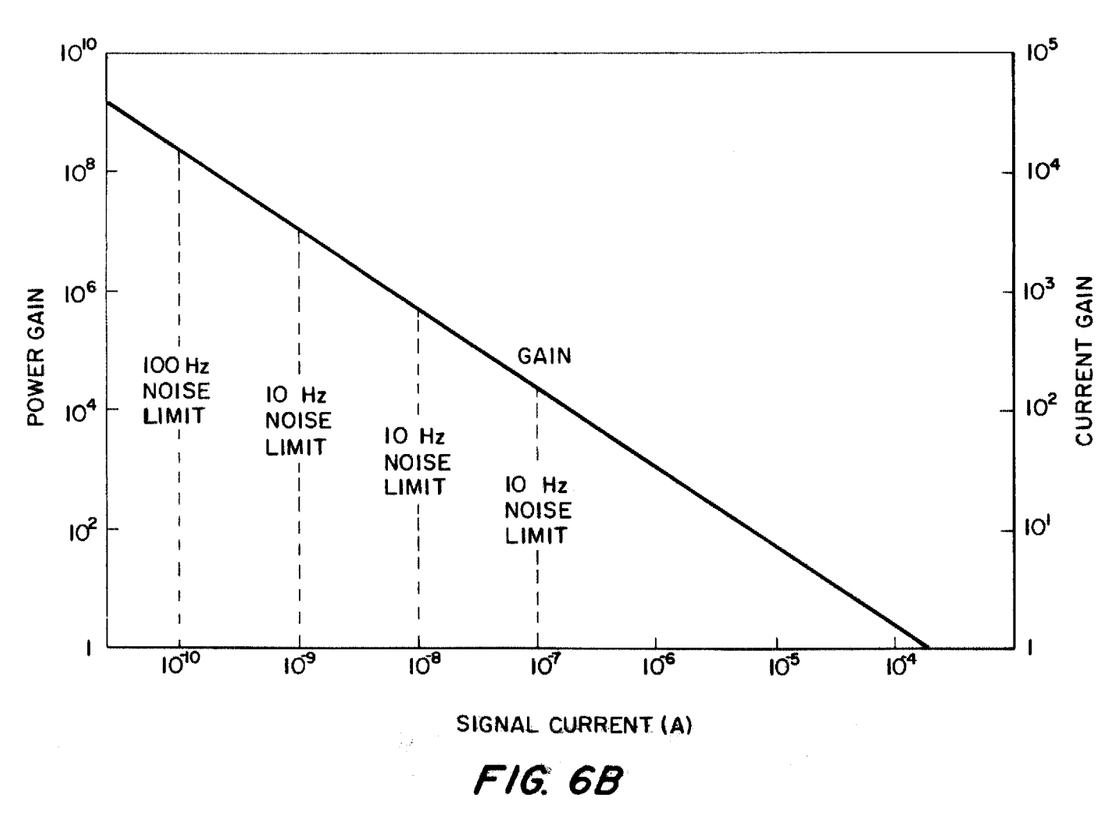
FIG. 6B is an orthogonal, two coordinate graph showing calculated power and current gain, in conjunction with band width noise limitations, as a function of signal current for embodiments of the instant invention.

FIG. 6B is a two coordinate graph showing gain, both current and power, as a function of the signal current. Additionally, FIG. 6B shows the limitation placed upon the signal current by Johnson noise, as a function of the bandwidth of the amplifiers. An amplifier with a $10^8$ megahertz bandwidth for example, has a noise equivalent current of $10^{-7}$ amperes solely due to Johnson noise.

Figure 7:
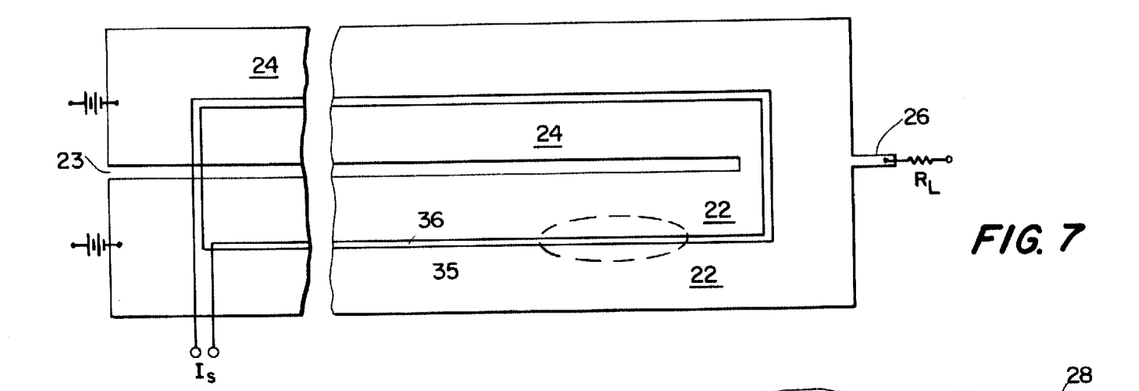
FIG. 7 is a top view of a magnetoresistive amplifier showing the signal and sense circuits.
Figure 8:
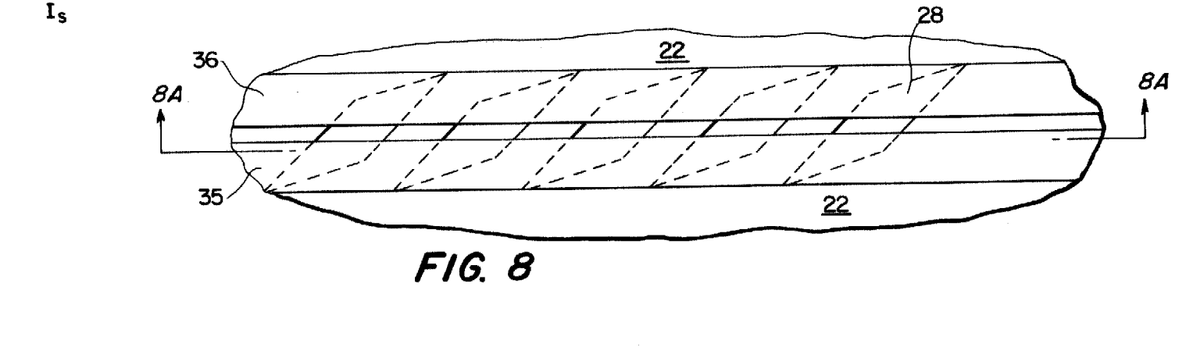
FIG. 8 is a top detail view of one segment of the magnetoresistive amplifier shown in FIG. 7.
Figure 8A:
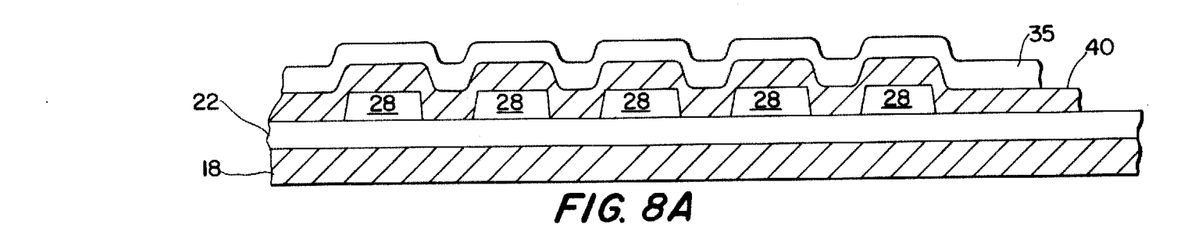
FIG. 8A is a sectional side view of the detail shown in FIG. 8.

FIG. 7 is a top view showing the sense and signal circuits of an alternate design for a magnetoresistive amplifier incorporating the present teachings. The resistive elements 22, 24 of the sense circuit are made from a single layer of ferromagnetic material deposited upon an insulating substrate 18, in FIG. 8A, having a short tail 26 capable of serving as a node point to which one terminal of a load circuit may be coupled. A gap 23 separates the two arms 22, 24. The remaining two arms of the balanced bridge forming the sense circuit are the two equal voltage sources coupled to the distal ends of the ferromagnetic layer. The hard axis of the ferromagnetic layer is parallel to the oblong length of the layer. The signal circuit is shown as a square spiral with two loops 35, 36 symmetrically spaced about the ferromagnetic layer in a plane parallel to that described by the top surface of the ferromagnetic layer. The signal current, $I_s$, is applied to the terminals of the square spiral. As shown in detail in FIG. 8A, a layer of an electrical insulator 40 separates the ferromagnetic sense circuit 22, 24 from the gold strips 35, 36, forming the signal circuit. FIG. 8 shows a feature of the amplifier intermediate the ferromagnetic layer 22, 24 and the insulator 40 too fine in detail to be shown in FIG. 7. That feature, a series of spaced apart parallelograms 28 positioned directly beneath the square loops 35, 36 of the signal circuit, is made by depositing discrete islands of an electrically conducting material such as gold, directly onto the surface of the two arms 22, 24 of the ferromagnetic layer. As an electrical current is inclined to seek the path of least resistance, the sense current flowing the arms 22, 24 of the ferromagnetic layer leaves the layer, passes through the lower resistance gold islands 28, and, then re-enter the ferromagnetic layer. It can be seen from the top view of the amplifier shown in FIG. 8 as the sense current alternately rises from the ferromagnetic layer 22 to each gold island 28, and then falls from the island to return to the layer 22 in order to traverse the gap between successive islands, that the sense current in arms 22, 24, still seeking the path of least resistance, tends to travel along paths normal to the facomg edges of successive gold islands. By following such a path, the sense current in the ferromagnetic layer tends to flow at angles of forty-five degrees to the current in the overlaid signal circuit 35, 36.

Although the islands of the electrically conducting material are represented in FIG. 8 by a series of identical parallelograms equally spaced apart in order to facilitate understanding of the principles upon which the amplifier relies, as long as most favored path of the sense current in the ferromagnetic layer underlying the spaces between neighboring islands defines an oblique angle of preferrably forty-five degrees with the hard axis of the layer, the islands may have any, even different, shapes (e.g., a regular shape such as a circular dot or an irregular shape with jagged edges). The islands may be placed on either side of the ferromagnetic layer; however, if the islands are placed on the bottom side of the ferromagnetic layer, next to the silicon or glass substrate 18, there is a possibility of discontinuities in the ferromagnetic layer because the islands are thicker than the ferromagnetic layer. Typical thicknesses of the several components are 0.1 microns for the ferromagnetic layer, 0.5 microns for the islands 28, 1.0 microns for the insulating substrate 40, and 1.0 microns for the gold signal circuit strip 35.

What is claimed, and desired to be secured by a letters patent is:

1. An amplifier, comprising:
   a layer of a ferromagnetic material having two arms adjoining a node:
   both arms having parallel, unidirectional hard axes;
   a magnetic bias field applied to orient magnetization in the ferromagnetic layer parallel to the hard axes;
   a plurality of islands of a material having an electrical conductivity greater than the electrical conductivity of the ferromagnetic material, deposited on a major surface of the layer underlying an electrical conductor and spaced apart so that an imaginary line tracing the least distance between facing edges of neighboring islands defines an oblique angle with the hard axis;
   the electrical conductor disposed in a plane parallel to the ferromagnetic layer as a continuous strip;
   the electrical conductor successively transversing each of the arms of the ferromagnetic layer along lines parallel to the hard axes; and
   an electrical insulator separating the electrical conductor from a current in the ferromagnetic layer.

2. An amplifier, comprising:
   a layer of a ferromagnetic material having two arms adjoining a node;
   both arms having parallel, unidirectional hard axes;
   a magnetic bias field applied to orient magnetization in the ferromagnetic layer parallel to the hard axes;
   an electrical conductor disposed in a plane parallel to the ferromagnetic layer as a continuous strip;
   the electrical conductor successively transversing each of the arms of the ferromagnetic layer along lines parallel to the hard axes;
   a plurality of quadrilateral islands each with a pair of parallel sides, of a material having an electrical conductivity greater than the electrical conductivity of the ferromagnetic material, deposited on a major surface of the layer directly underlying but separated by an insulator from the electrical conductor and uniformly spaced apart along the arms whereby the shortest electrical path between facing parallel sides of neighboring islands defines an oblique angle with the hard axes; and
   the insulator separating the electrical conductor from any current in the ferromagnetic layer.

3. An amplifier, as set forth in claim 1 or 2, wherein the electrical conductor forms a spiral.

4. An amplifier, as set forth in claim 3, wherein the spiral is symmetric about the node.

5. An amplifier, as set forth in claim 1 or 2, wherein the electrical conductor successively transverses each of the arms, and aggregately transits each of the arms an equal number of times.

6. An amplifier, as set forth in claim 1 or 2, wherein the angle is on the order of forty-five degrees.

7. An amplifier, comprising:
   a balanced bridge sense circuit having two arms and an intermediate node formed by a thin-film of a ferromagnetic material exhibiting an anisotropy field and an unidirectional hard axis;

a magnetic bias field with a magnitude equal to the magnitude of the anisotropy field, applied to the thin-film in a direction parallel to the hard axis;

a continuous strip of an electrically conducting material overlain in a plane parallel to the ferromagnetic layer, alternately transversing each of the arms along lines parallel to the hard axis;

a plurality of islands of a material having an electrical conductivity greater than the electrical conductivity of the ferromagnetic material, deposited upon a surface of the thin-film directly underlying the electrical conductor and uniformly spaced apart along the arms whereby the shortest electrical path between neighboring islands defines an oblique angle with the hard axis; and an electrical insulator separating the electrical conductor from a current in the sense circuit.

8. An amplifier, comprising:

a balanced bridge sense circuit having two arms and an intermediate node formed by a thin-film of a ferromagnetic material exhibiting an anisotropy field and an unidirectional hard axis;

a magnetic bias field with a magnitude equal to the magnitude of the anisotropy field, applied to the thin-film in a direction parallel to the hard axis;

a continuous strip of an electrically conducting material overlain in a plane parallel to the ferromagnetic layer, alternately transversing each of the arms along lines parallel to the hard axis.

a plurality of quadrilateral islands each with a pair of parallel sides, of a material having an electrical conductivity greater than the electrical conductivity of the ferromagnetic material, deposited on a surface of the thin-film beneath and parallel to the overlaid electrical conductor and uniformly spaced apart equidistantly whereby the shortest electrical path between facing sides of neighboring islands defines an oblique angle with the hard axis.

9. An amplifier, as set forth in claim 7 or 8, wherein the strip of electrically conducting material forms a spiral.

10. An amplifier, as set forth in claim 9, wherein the spiral is symmetric about the node.

11. An amplifier, as set forth in claim 9, wherein the spiral is centered upon the node.

12. An amplifier, as set forth in claim 9, wherein the strip aggregately transits each of the arms an equal number of times.

13. An amplifier, as set forth in claim 7 or 8, wherein the angle is on the order of forty-five degrees.

* * * * *